US010432226B2

(12) United States Patent
Park et al.

(10) Patent No.: US 10,432,226 B2
(45) Date of Patent: Oct. 1, 2019

(54) LOW DENSITY PARITY CHECK ENCODER HAVING LENGTH OF 64800 AND CODE RATE OF 5/15, AND LOW DENSITY PARITY CHECK ENCODING METHOD USING THE SAME

(71) Applicant: ELECTRONICS AND TELECOMMUNICATIONS RESEARCH INSTITUTE, Daejeon (KR)

(72) Inventors: Sung-Ik Park, Daejeon (KR); Heung-Mook Kim, Daejeon (KR); Sun-Hyoung Kwon, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/907,025

(22) Filed: Feb. 27, 2018

(65) Prior Publication Data
US 2018/0191378 A1    Jul. 5, 2018

Related U.S. Application Data

(63) Continuation of application No. 15/642,199, filed on Jul. 5, 2017, now Pat. No. 9,941,902, which is a
(Continued)

(30) Foreign Application Priority Data

Aug. 14, 2014   (KR) .......................... 10-2014-0106181
Sep. 4, 2014    (KR) .......................... 10-2014-0117504

(51) Int. Cl.
*H03M 13/11*    (2006.01)
*H04L 1/00*     (2006.01)
(Continued)

(52) U.S. Cl.
CPC .... *H03M 13/1185* (2013.01); *H03M 13/1102* (2013.01); *H03M 13/1105* (2013.01);
(Continued)

(58) Field of Classification Search
CPC ........... H03M 13/1177; H03M 13/116; H03M 13/1165; H03M 13/255; H03M 13/1185;
(Continued)

(56) References Cited

U.S. PATENT DOCUMENTS 9,225,358 B2 *  12/2015  Park ..................... H03M 13/116
9,490,843 B2 *  11/2016  Park ................... H03M 13/1177
(Continued)

FOREIGN PATENT DOCUMENTS

CA         2940275 A1      8/2015
KR   10-2007-0058438 A    6/2007
(Continued)

OTHER PUBLICATIONS

Yiyan Wu et al., "Cloud Transmission: A New Spectrum-Reuse Friendly Digital Terrestrial Broadcasting Transmission System", IEEE Transactions on Broadcasting, Sep. 2012, pp. 329-337, vol. 58, No. 3.
(Continued)

*Primary Examiner* — John J Tabone, Jr.

(57) ABSTRACT

A low density parity check (LDPC) encoder, an LDPC decoder, and an LDPC encoding method are disclosed. The LDPC encoder includes first memory, second memory, and a processor. The first memory stores an LDPC codeword having a length of 64800 and a code rate of 5/15. The second memory is initialized to 0. The processor generates the LDPC codeword corresponding to information bits by performing accumulation with respect to the second memory using a sequence corresponding to a parity check matrix (PCM).

6 Claims, 5 Drawing Sheets

Related U.S. Application Data continuation of application No. 15/271,941, filed on Sep. 21, 2016, now Pat. No. 9,735,808, which is a continuation of application No. 14/495,803, filed on Sep. 24, 2014, now Pat. No. 9,496,896.

(51) Int. Cl.
   *H03M 13/25* (2006.01)
   *H03M 13/00* (2006.01)

(52) U.S. Cl.
   CPC ...... *H03M 13/116* (2013.01); *H03M 13/1165* (2013.01); *H03M 13/255* (2013.01); *H03M 13/616* (2013.01); *H04L 1/0041* (2013.01); *H04L 1/0043* (2013.01); *H04L 1/0057* (2013.01); *H04L 1/0065* (2013.01)

(58) Field of Classification Search
   CPC ......... H03M 13/1102; H03M 13/1105; H03M 13/616; H03M 13/6552; H04L 1/0057; H04L 1/0041; H04L 1/0043; H04L 1/0065
   USPC .................. 714/752, 758, 776, 800, 801
   See application file for complete search history.

(56) References Cited

U.S. PATENT DOCUMENTS

| | | | |
|---|---|---|---|
| 9,735,807 B2 * | 8/2017 | Park | H03M 13/1177 |
| 2008/0178065 A1 | 7/2008 | Khandekar et al. | |
| 2010/0146371 A1 * | 6/2010 | Efimov | H03M 13/1111 714/780 |
| 2011/0283158 A1 | 11/2011 | Yang et al. | |
| 2014/0157079 A1 * | 6/2014 | Park | H03M 13/116 714/758 |
| 2015/0039973 A1 * | 2/2015 | Jeong | H03M 13/11 714/776 |
| 2015/0082118 A1 * | 3/2015 | Jeong | H03M 13/1165 714/758 |
| 2015/0082131 A1 * | 3/2015 | Jeong | H04L 1/0057 714/776 |
| 2015/0089320 A1 * | 3/2015 | Jeong | H03M 13/255 714/758 |
| 2015/0089321 A1 * | 3/2015 | Myung | H03M 13/036 714/758 |
| 2015/0095744 A1 * | 4/2015 | Jeong | H03M 13/2792 714/776 |
| 2015/0100844 A1 * | 4/2015 | Park | H03M 13/1177 714/752 |
| 2015/0100845 A1 * | 4/2015 | Myung | H03M 13/2778 714/752 |
| 2015/0121176 A1 * | 4/2015 | Myung | H04L 1/0041 714/776 |
| 2015/0128005 A1 * | 5/2015 | Jeong | H03M 13/036 714/752 |
| 2015/0214982 A1 * | 7/2015 | Park | H04L 27/20 714/752 |
| 2015/0229328 A1 * | 8/2015 | Park | H03M 13/1102 714/776 |
| 2015/0229334 A1 * | 8/2015 | Park | H03M 13/2792 714/776 |
| 2015/0229335 A1 * | 8/2015 | Park | H03M 13/2792 714/776 |
| 2015/0229336 A1 * | 8/2015 | Park | H03M 13/2792 714/776 |
| 2015/0236720 A1 * | 8/2015 | Park | H03M 13/116 714/752 |
| 2015/0236721 A1 * | 8/2015 | Kim | H04L 1/0041 714/776 |
| 2015/0236722 A1 * | 8/2015 | Park | H03M 13/036 714/776 |
| 2015/0236816 A1 * | 8/2015 | Myung | H04L 1/0041 714/776 |
| 2015/0256202 A1 * | 9/2015 | Park | H03M 13/1165 714/762 |
| 2015/0270853 A1 * | 9/2015 | Jeong | H03M 13/2792 714/752 |
| 2015/0270854 A1 * | 9/2015 | Park | H03M 13/036 714/776 |
| 2015/0280747 A1 * | 10/2015 | Park | H03M 13/2778 714/752 |
| 2015/0339190 A1 * | 11/2015 | Park | H03M 13/1102 714/766 |
| 2015/0339191 A1 * | 11/2015 | Park | G06F 11/1076 714/766 |
| 2015/0341047 A1 * | 11/2015 | Park | G06F 11/1076 714/766 |
| 2015/0341048 A1 * | 11/2015 | Park | H03M 13/1102 714/766 |
| 2015/0341052 A1 * | 11/2015 | Jeong | H03M 13/1102 714/776 |
| 2015/0341053 A1 * | 11/2015 | Kim | H03M 13/1102 714/776 |
| 2015/0341054 A1 * | 11/2015 | Myung | H03M 13/1102 714/776 |
| 2016/0013809 A1 * | 1/2016 | Myung | H03M 13/1165 714/776 |
| 2016/0049957 A1 * | 2/2016 | Park | H03M 13/1177 714/776 |
| 2017/0012645 A1 * | 1/2017 | Park | H03M 13/1177 |
| 2017/0324426 A1 * | 11/2017 | Park | H03M 13/1177 |

FOREIGN PATENT DOCUMENTS

| | | |
|---|---|---|
| KR | 10-2013-0135746 A | 12/2013 |
| WO | WO 2006/001666 A2 | 1/2006 |

OTHER PUBLICATIONS

"Proposal to the ATSC 3.0 PHY Layer CfP Cloud Transmission for the ATSC 3.0 PHY Layer," A Joint Proposal by Communications Research Centre Canada and Electronics and Telecommunications. Research Institute Korea, Sep. 26, 2013, pp. 1-101, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Oct. 21, 2013, pp. 1-138, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Dec. 5, 2013, pp. 1-138, CRC Canada and ETRI Korea.

Yung-Sik Kwon, Declaration filed on Jun. 17, 2016 in related U.S. Appl. No. 14/496,457, in support of the cited document entitled "Proposal to the ATSC 3.0 PHY Layer CfP Cloud Transmission for the ATSC 3.0 PHY Layer".

\* cited by examiner

LOW DENSITY PARITY CHECK ENCODER HAVING LENGTH OF 64800 AND CODE RATE OF 5/15, AND LOW DENSITY PARITY CHECK ENCODING METHOD USING THE SAME

CROSS-REFERENCE TO RELATED APPLICATIONS

This application is a continuation of U.S. patent application Ser. No. 15/642,199 filed Jul. 5, 2017, now U.S. Pat. No. 9,941,902, which is a continuation of U.S. patent application Ser. No. 15/271,941 filed Sep. 21, 2016, now U.S. Pat. No. 9,735,808 issued Aug. 15, 2017, which is a continuation of and claims priority to U.S. application Ser. No. 14/495,803 filed Sep. 24, 2014, now U.S. Pat. No. 9,496,896 issued Nov. 15, 2016, which claims the benefit of Korean Patent Application Nos. 10-2014-0106181 and 10-2014-0117504, filed Aug. 14, 2014 and Sep. 4, 2014, respectively, which are hereby incorporated by reference herein in their entirety.

BACKGROUND

1. Technical Field

The present disclosure relates generally to a low density parity check (LDPC) code that is used to correct errors occurring over a wireless channel, and, more particularly, to an LDPC code that is applicable to a digital broadcasting system.

2. Description of the Related Art

Current terrestrial television (TV) broadcasting generates co-channel interference across an area within a distance that is three times a service radius, and thus the same frequency cannot be reused in the area within the distance that is three times the service radius. An area in which the same frequency cannot be reused is called a white space. Spectrum efficiency significantly deteriorates due to the occurrence of a white space.

Accordingly, there arises a need for the development of a transmission technology that facilitates the elimination of a white space and the reuse of a frequency with an emphasis on reception robustness in order to improve spectrum efficiency.

In response to this, the paper "Cloud Transmission: A New Spectrum-Reuse Friendly Digital Terrestrial Broadcasting Transmission System" published on September of 2012 in IEEE Transactions on Broadcasting, Vol. 58, No. 3 proposes a terrestrial cloud transmission technology that facilitates reuse, does not generate a white space, and makes the construction and operation of a single frequency network easy.

Using this terrestrial cloud transmission technology, a broadcasting station can transmit the same nationwide content or locally different content over a single broadcasting channel. However, for this purpose, a receiver should receive one or more terrestrial cloud broadcast signals in an area in which signals transmitted from different transmitters overlap each other, that is, an overlap area, over a single frequency network, and then should distinguish and demodulate the received terrestrial cloud broadcast signals. That is, the receiver should demodulate one or more cloud broadcast signals in a situation in which co-channel interference is present and the timing and frequency synchronization between transmitted signals are not guaranteed.

Meanwhile, Korean Patent Application Publication No. 2013-0135746 entitled "Low Density Parity Check Code for Terrestrial Cloud Transmission" discloses an LDPC code that is optimized for terrestrial cloud transmission and exhibits excellent performance at low code rate (<0.5).

However, Korean Patent Application Publication No. 2013-0135746 is directed to a code length completely different from an LDPC code length used in the DVB broadcast standard, etc., and does not teach a specific LDPC encoding method.

SUMMARY

At least one embodiment of the present invention is directed to the provision of a new LDPC codeword having a length of 64800 and a code rate of 5/15, which is capable of being used for general purposes.

At least one embodiment of the present invention is directed to the provision of an LDPC encoding technique that is capable of efficiently performing LDPC encoding using a sequence having a number of rows equal to a value that is obtained by dividing the sum of the length of the systematic part of an LDPC codeword, that is, 21600, and the length of the first parity part of the LDPC codeword, that is, 1440, by 360.

In accordance with an aspect of the present invention, there is provided an LDPC encoder, including first memory configured to store an LDPC codeword having a length of 64800 and a code rate of 5/15; second memory configured to be initialized to 0; and a processor configured to generate the LDPC codeword corresponding to information bits by performing accumulation with respect to the second memory using a sequence corresponding to a parity check matrix (PCM).

The accumulation may be performed at parity bit addresses that are updated using the sequence corresponding to the PCM.

The LDPC codeword may include a systematic part corresponding to the information bits and having a length of 21600, a first parity part corresponding to a dual diagonal matrix included in the PCM and having a length of 1440, and a second parity part corresponding to an identity matrix included in the PCM and having a length of 41760.

The sequence may have a number of rows equal to the sum of a value obtained by dividing a length of the systematic part, that is, 21600, by a circulant permutation matrix (CPM) size corresponding to the PCM, that is, 360, and a value obtained by dividing a length of the first parity part, that is, 1440, by the CPM size.

The sequence may be represented by the following Sequence Table:

| Sequence Table | |
|---|---|
| 1st row: | 221 1011 1218 4299 7143 8728 11072 15533 17356 33909 36833 |
| 2nd row: | 360 1210 1375 2313 3493 16822 21373 23588 23656 26267 34098 |
| 3rd row: | 544 1347 1433 2457 9186 10945 13583 14858 19195 34606 37441 |
| 4th row: | 37 596 715 4134 8091 12106 24307 24658 34108 40591 42883 |

Sequence Table (continued)

| | |
|---|---|
| 5th row: | 235 398 1204 2075 6742 11670 13512 23231 24784 27915 34752 |
| 6th row: | 204 873 890 13550 16570 19774 34012 35249 37655 39885 42890 |
| 7th row: | 221 371 514 11984 14972 15690 28827 29069 30531 31018 43121 |
| 8th row: | 280 549 1435 1889 3310 10234 11575 15243 20748 30469 36005 |
| 9th row: | 223 666 1248 13304 14433 14732 18943 21248 23127 38529 39272 |
| 10th row: | 370 819 1065 9461 10319 25294 31958 33542 37458 39681 40039 |
| 11st row: | 585 870 1028 5087 5216 12228 16216 16381 16937 27132 27893 |
| 12nd row: | 164 167 1210 7386 11151 20413 22713 23134 24188 36771 38992 |
| 13rd row: | 298 511 809 4620 7347 8873 19602 24162 29198 34304 41145 |
| 14th row: | 105 830 1212 2415 14759 15440 16361 16748 22123 32684 42575 |
| 15th row: | 659 665 668 6458 22130 25972 30697 31074 32048 36078 37129 |
| 16th row: | 91 808 953 8015 8988 13492 13987 15979 28355 34509 39698 |
| 17th row: | 594 983 1265 3028 4029 9366 11069 11512 27066 40939 41639 |
| 18th row: | 506 740 1321 1484 10747 16376 17384 20285 31502 38925 42606 |
| 19th row: | 338 356 975 2022 3578 18689 18772 19826 22914 24733 27431 |
| 20th row: | 709 1264 1366 4617 8893 25226 27800 29080 30277 37781 39644 |
| 21st row: | 840 1179 1338 2973 3541 7043 12712 15005 17149 19910 36795 |
| 22nd row: | 1009 1267 1380 4919 12679 22889 29638 30987 34637 36232 37284 |
| 23rd row: | 466 913 1247 1646 3049 5924 9014 20539 34546 35029 36540 |
| 24th row: | 374 697 984 1654 5870 10883 11684 20294 28888 31612 34031 |
| 25th row: | 117 240 635 5093 8673 11323 12456 14145 21397 39619 42559 |
| 26th row: | 122 1265 1427 13528 14282 15241 16852 17227 34723 36836 39791 |
| 27th row: | 595 1180 1310 6952 17916 24725 24971 27243 29555 32138 35987 |
| 28th row: | 140 470 1017 13222 13253 18462 20806 21117 28673 31598 37235 |
| 29th row: | 7 710 1072 8014 10804 13303 14292 16690 26676 36443 41966 |
| 30th row: | 48 189 759 12438 14523 16388 23178 27315 28656 29111 29694 |
| 31st row: | 285 387 410 4294 4467 5949 25386 27898 34880 41169 42614 |
| 32nd row: | 474 545 1320 10506 13186 18126 27110 31498 35353 36193 37322 |
| 33rd row: | 1075 1130 1424 11390 13312 14161 16927 25071 25844 34287 38151 |
| 34th row: | 161 396 427 5944 17281 22201 25218 30143 35566 38261 42513 |
| 35th row: | 233 247 694 1446 3180 3507 9069 20764 21940 33422 39358 |
| 36th row: | 271 508 1013 6271 21760 21858 24887 29808 31099 35475 39924 |
| 37th row: | 8 674 1329 3135 5110 14460 28108 28388 31043 31137 31863 |
| 38th row: | 1035 1222 1409 8287 16083 24450 24888 29356 30329 37834 39684 |
| 39th row: | 391 1090 1128 1866 4095 10643 13121 14499 20056 22195 30593 |
| 40th row: | 55 161 1402 6289 6837 8791 17937 21425 26602 30461 37241 |
| 41st row: | 110 377 1228 6875 13253 17032 19008 23274 32285 33452 41630 |
| 42nd row: | 360 638 1355 5933 12593 13533 23377 23881 24586 26040 41663 |
| 43rd row: | 535 1240 1333 3354 10860 16032 32573 34908 34957 39255 40759 |
| 44th row: | 526 936 1321 7992 10260 18527 28248 29356 32636 34666 35552 |
| 45th row: | 336 785 875 7530 13062 13075 18925 27963 28703 33688 36502 |
| 46th row: | 36 591 1062 1518 3821 7048 11197 17781 19408 22731 24783 |
| 47th row: | 214 1145 1223 1546 9475 11170 16061 21273 38688 40051 42479 |
| 48th row: | 1136 1226 1423 20227 22573 24951 26462 29586 34915 42441 43048 |
| 49th row: | 26 276 1425 6048 7224 7917 8747 27559 28515 35002 37649 |
| 50th row: | 127 294 437 4029 8585 9647 11904 24115 28514 36893 39722 |
| 51st row: | 748 1093 1403 9536 19305 20468 31049 38667 40502 40720 41949 |
| 52nd row: | 96 638 743 9806 12101 17751 22732 24937 32007 32594 38504 |
| 53rd row: | 649 904 1079 2770 3337 9158 20125 24619 32921 33698 35173 |
| 54th row: | 401 518 984 7372 12438 12582 18704 35874 39420 39503 39790 |
| 55th row: | 10 451 1077 8078 16320 17409 25807 28814 30613 41261 42955 |
| 56th row: | 405 592 1178 15936 18418 19585 21966 24219 30637 34536 37838 |
| 57th row: | 50 584 851 9720 11919 22544 22545 25851 35567 41587 41876 |
| 58th row: | 911 1113 1176 1806 10058 10809 14220 19044 20748 29424 36671 |
| 59th row: | 441 550 1135 1956 11254 18699 30249 33099 34587 35243 39952 |
| 60th row: | 510 1016 1281 8621 13467 13780 15170 16289 20925 26426 34479 |
| 61st row: | 4969 5223 17117 21950 22144 24043 27151 39809 |
| 62nd row: | 11452 13622 18918 19670 23995 32647 37200 37399 |
| 63rd row: | 6351 6426 13185 13973 16699 22524 31070 31916 |
| 64th row: | 4098 10617 14854 18004 28580 36158 37500 38552 |

The accumulation may be performed while the rows of the sequence are being repeatedly changed by the CPM size of the PCM.

In accordance with an aspect of the present invention, there is provided an LDPC encoding method, including initializing first memory configured to store an LDPC codeword and second memory; and generating the LDPC codeword corresponding to information bits by performing accumulation with respect to the second memory using a sequence corresponding to a PCM.

The accumulation may be performed at parity bit addresses that are updated using the sequence corresponding to the PCM.

The LDPC codeword may include a systematic part corresponding to the information bits and having a length of 21600, a first parity part corresponding to a dual diagonal matrix included in the PCM and having a length of 1440, and a second parity part corresponding to an identity matrix included in the PCM and having a length of 41760.

The sequence may have a number of rows equal to the sum of a value obtained by dividing a length of the systematic part, that is, 21600, by a circulant permutation matrix (CPM) size corresponding to the PCM, that is, 360, and a value obtained by dividing a length of the first parity part, that is, 1440, by the CPM size.

The sequence may be represented by the above Sequence Table.

In accordance with still another aspect of the present invention, there is provided an LDPC decoder, including a receiving unit configured to receive an LDPC codeword encoded using a sequence corresponding to a PCM and is represented by the above Sequence Table; and a decoding unit configured to restore information bits from the received LDPC codeword by performing decoding corresponding to the PCM.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
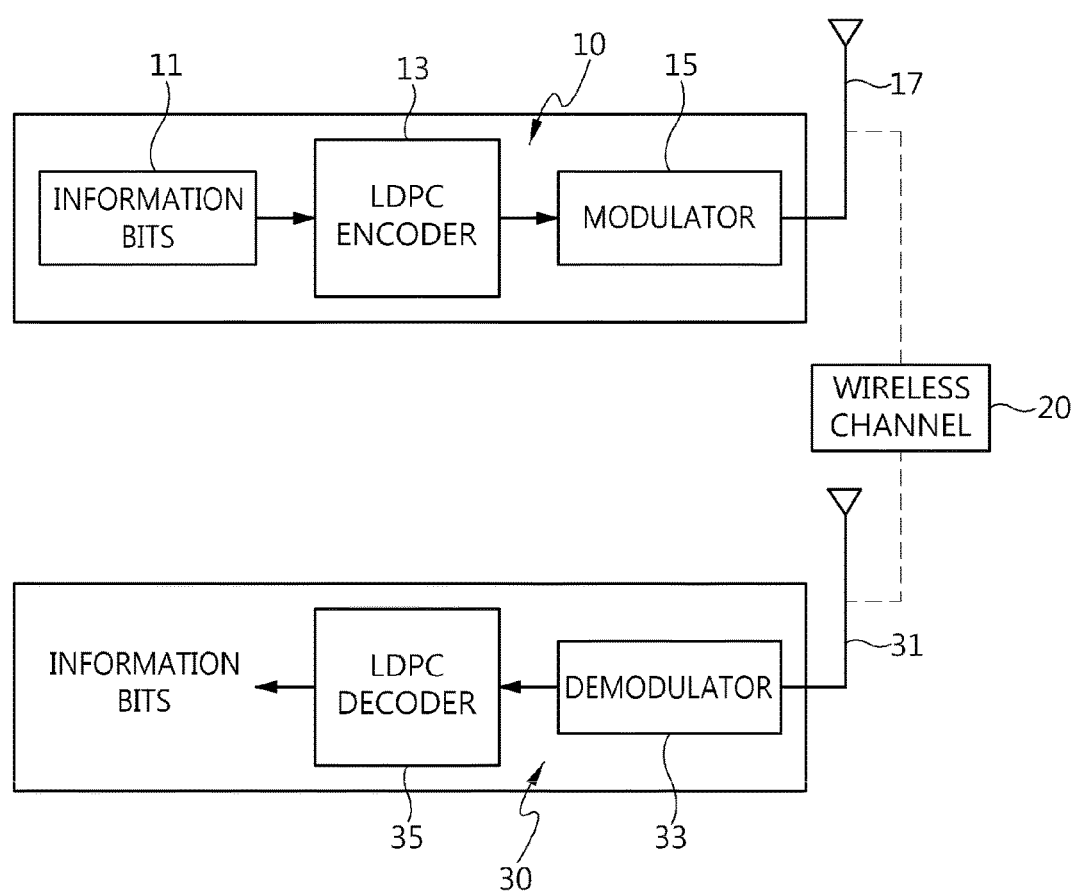
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a transmitter 10 and a receiver 30 communicate with each other over a wireless channel 20.

The transmitter 10 generates an n-bit codeword by encoding k information bits using an LDPC encoder 13. The codeword is modulated by the modulator 15, and is transmitted via an antenna 17. The signal transmitted via the wireless channel 20 is received via the antenna 31 of the receiver 30, and, in the receiver 30, is subjected to a process reverse to the process in the transmitter 10. That is, the received data is demodulated by a demodulator 33, and is then decoded by an LDPC decoder 35, thereby finally restoring the information bits.

It will be apparent to those skilled in the art that the above-described transmission and reception processes have been described within a minimum range required for a description of the features of the present invention and various processes required for data transmission may be added.

In the following, the specific processes of encoding and decoding that are performed using an LDPC code in the LDPC encoder 13 or LDPC decoder 35 and the specific configurations of encoding and decoding devices, such as the LDPC encoder 13 and the LDPC decoder 35, are described. The LDPC encoder 13 illustrated in FIG. 1 may have a structure illustrated in FIG. 4, and the LDPC decoder 35 may have a structure illustrated in FIG. 5.

Figure 2:
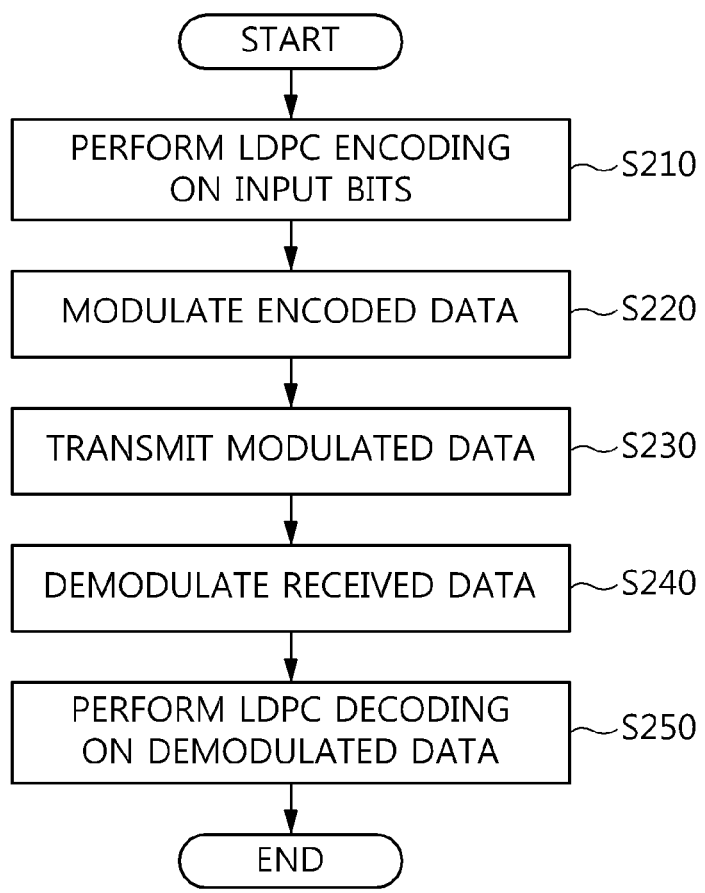
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to LDPC encoding at step S210.

That is, at step S210, an n-bit codeword is generated by encoding k information bits using the LDPC encoder.

Figure 6:
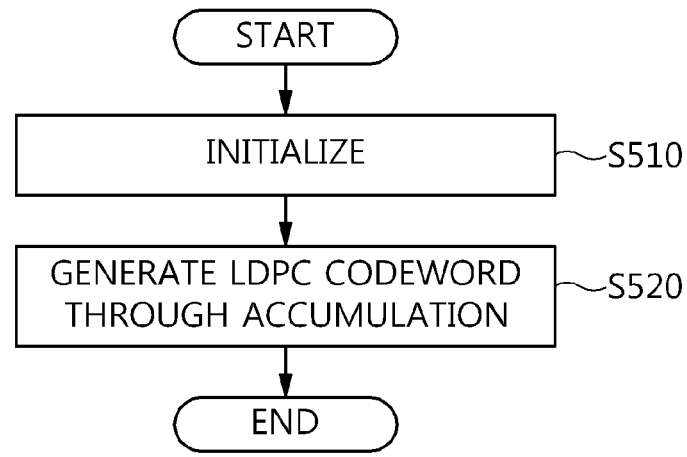
FIG. 6 is an operation flowchart illustrating an LDPC encoding method according to an embodiment of the present invention.

In this case, step S210 may be performed as in an LDPC encoding method illustrated in FIG. 6.

Furthermore, in the broadcast signal transmission and reception method, the encoded data is modulated at step S220.

That is, at step S220, the encoded n-bit codeword is modulated using the modulator.

Furthermore, in the broadcast signal transmission and reception method, the modulated data is transmitted at step S230.

That is, at step S230, the modulated codeword is transmitted over a wireless channel via the antenna.

Furthermore, in the broadcast signal transmission and reception method, the received data is demodulated at step S240.

That is, at step S240, the signal transmitted over the wireless channel is received via the antenna of the receiver, and the received data is demodulated using the demodulator.

Furthermore, in the broadcast signal transmission and reception method, the demodulated data is subjected to LDPC decoding at step S250.

That is, at step S250, the information bits are finally restored by performing LDPC decoding using the demodulator of the receiver.

Figure 5:
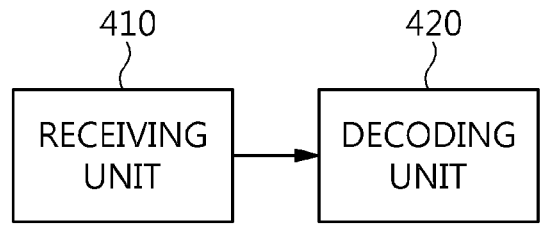
FIG. 5 is a block diagram illustrating an LDPC decoder according to an embodiment of the present invention.

In this case, step S250 corresponds to a process reverse to that of the LDPC encoding method illustrated in FIG. 6, and may correspond to the LDPC decoder of FIG. 5.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \ldots & J^{a_{1n}} \\ J^{a_{21}} & J^{a_{22}} & \ldots & J^{a_{2n}} \\ \vdots & \vdots & \ddots & \vdots \\ J^{a_{m1}} & J^{a_{m2}} & \ldots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \\ 1 & 0 & 0 & \ldots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
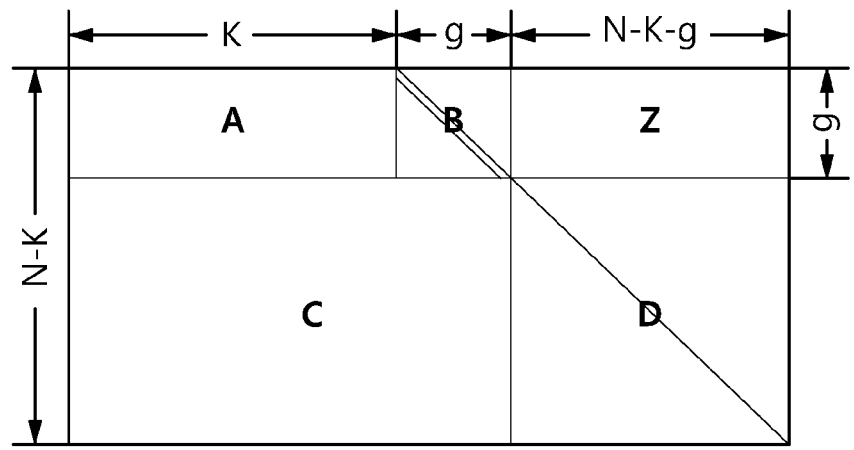
FIG. 3 is a diagram illustrating the structure of a PCM corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \ldots & 0 & 0 & 0 \\ I_{L \times L} & I_{L \times L} & 0 & \ldots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \ldots & I_{L \times L} & I_{L \times L} & 0 \\ 0 & 0 & 0 & \ldots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 5/15 and the length of a codeword is 64800, as illustrated in the following Table 1. That is, the present invention proposes an LDPC code that is designed to receive information having a length of 21600 and generate an LDPC codeword having a length of 64800.

Table 1 illustrates the sizes of the matrices A, B, C, D and Z of the QC-LDPC code according to the present invention:

TABLE 1

| Code | | Sizes | | | | |
|---|---|---|---|---|---|---|
| rate | Length | A | B | C | D | Z |
| 5/15 | 64800 | 1440 × 21600 | 1440 × 1440 | 41760 × 23040 | 41760 × 41760 | 1080 × 41760 |

The newly designed LDPC code may be represented in the form of a sequence (progression), an equivalent relationship is established between the sequence and matrix (parity bit check matrix), and the sequence may be represented, as follows:

| Sequence Table | |
|---|---|
| 1st row: | 221 1011 1218 4299 7143 8728 11072 15533 17356 33909 36833 |
| 2nd row: | 360 1210 1375 2313 3493 16822 21373 23588 23656 26267 34098 |
| 3rd row: | 544 1347 1433 2457 9186 10945 13583 14858 19195 34606 37441 |
| 4th row: | 37 596 715 4134 8091 12106 24307 24658 34108 40591 42883 |
| 5th row: | 235 398 1204 2075 6742 11670 13512 23231 24784 27915 34752 |
| 6th row: | 204 873 890 13550 16570 19774 34012 35249 37655 39885 42890 |
| 7th row: | 221 371 514 11984 14972 15690 28827 29069 30531 31018 43121 |
| 8th row: | 280 549 1435 1889 3310 10234 11575 15243 20748 30469 36005 |
| 9th row: | 223 666 1248 13304 14433 14732 18943 21248 23127 38529 39272 |
| 10th row: | 370 819 1065 9461 10319 25294 31958 33542 37458 39681 40039 |
| 11st row: | 585 870 1028 5087 5216 12228 16216 16381 16937 27132 27893 |
| 12nd row: | 164 167 1210 7386 11151 20413 22713 23134 24188 36771 38992 |
| 13rd row: | 298 511 809 4620 7347 8873 19602 24162 29198 34304 41145 |
| 14th row: | 105 830 1212 2415 14759 15440 16361 16748 22123 32684 42575 |
| 15th row: | 659 665 668 6458 22130 25972 30697 31074 32048 36078 37129 |
| 16th row: | 91 808 953 8015 8988 13492 13987 15979 28355 34509 39698 |
| 17th row: | 594 983 1265 3028 4029 9366 11069 11512 27066 40939 41639 |

Sequence Table

| | |
|---|---|
| 18th row: | 506 740 1321 1484 10747 16376 17384 20285 31502 38925 42606 |
| 19th row: | 338 356 975 2022 3578 18689 18772 19826 22914 24733 27431 |
| 20th row: | 709 1264 1366 4617 8893 25226 27800 29080 30277 37781 39644 |
| 21st row: | 840 1179 1338 2973 3541 7043 12712 15005 17149 19910 36795 |
| 22nd row: | 1009 1267 1380 4919 12679 22889 29638 30987 34637 36232 37284 |
| 23rd row: | 466 913 1247 1646 3049 5924 9014 20539 34546 35029 36540 |
| 24th row: | 374 697 984 1654 5870 10883 11684 20294 28888 31612 34031 |
| 25th row: | 117 240 635 5093 8673 11323 12456 14145 21397 39619 42559 |
| 26th row: | 122 1265 1427 13528 14282 15241 16852 17227 34723 36836 39791 |
| 27th row: | 595 1180 1310 6952 17916 24725 24971 27243 29555 32138 35987 |
| 28th row: | 140 470 1017 13222 13253 18462 20806 21117 28673 31598 37235 |
| 29th row: | 7 710 1072 8014 10804 13303 14292 16690 26676 36443 41966 |
| 30th row: | 48 189 759 12438 14523 16388 23178 27315 28656 29111 29694 |
| 31st row: | 285 387 410 4294 4467 5949 25386 27898 34880 41169 42614 |
| 32nd row: | 474 545 1320 10506 13186 18126 27110 31498 35353 36193 37322 |
| 33rd row: | 1075 1130 1424 11390 13312 14161 16927 25071 25844 34287 38151 |
| 34th row: | 161 396 427 5944 17281 22201 25218 30143 35566 38261 42513 |
| 35th row: | 233 247 694 1446 3180 3507 9069 20764 21940 33422 39358 |
| 36th row: | 271 508 1013 6271 21760 21858 24887 29808 31099 35475 39924 |
| 37th row: | 8 674 1329 3135 5110 14460 28108 28388 31043 31137 31863 |
| 38th row: | 1035 1222 1409 8287 16083 24450 24888 29356 30329 37834 39684 |
| 39th row: | 391 1090 1128 1866 4095 10643 13121 14499 20056 22195 30593 |
| 40th row: | 55 161 1402 6289 6837 8791 17937 21425 26602 30461 37241 |
| 41st row: | 110 377 1228 6875 13253 17032 19008 23274 32285 33452 41630 |
| 42nd row: | 360 638 1355 5933 12593 13533 23377 23881 24586 26040 41663 |
| 43rd row: | 535 1240 1333 3354 10860 16032 32573 34908 34957 39255 40759 |
| 44th row: | 526 936 1321 7992 10260 18527 28248 29356 32636 34666 35552 |
| 45th row: | 336 785 875 7530 13062 13075 18925 27963 28703 33688 36502 |
| 46th row: | 36 591 1062 1518 3821 7048 11197 17781 19408 22731 24783 |
| 47th row: | 214 1145 1223 1546 9475 11170 16061 21273 38688 40051 42479 |
| 48th row: | 1136 1226 1423 20227 22573 24951 26462 29586 34915 42441 43048 |
| 49th row: | 26 276 1425 6048 7224 7917 8747 27559 28515 35002 37649 |
| 50th row: | 127 294 437 4029 8585 9647 11904 24115 28514 36893 39722 |
| 51st row: | 748 1093 1403 9536 19305 20468 31049 38667 40502 40720 41949 |
| 52nd row: | 96 638 743 9806 12101 17751 22732 24937 32007 32594 38504 |
| 53rd row: | 649 904 1079 2770 3337 9158 20125 24619 32921 33698 35173 |
| 54th row: | 401 518 984 7372 12438 12582 18704 35874 39420 39503 39790 |
| 55th row: | 10 451 1077 8078 16320 17409 25807 28814 30613 41261 42955 |
| 56th row: | 405 592 1178 15936 18418 19585 21966 24219 30637 34536 37838 |
| 57th row: | 50 584 851 9720 11919 22544 22545 25851 35567 41587 41876 |
| 58th row: | 911 1113 1176 1806 10058 10809 14220 19044 20748 29424 36671 |
| 59th row: | 441 550 1135 1956 11254 18699 30249 33099 34587 35243 39952 |
| 60th row: | 510 1016 1281 8621 13467 13780 15170 16289 20925 26426 34479 |
| 61st row: | 4969 5223 17117 21950 22144 24043 27151 39809 |
| 62nd row: | 11452 13622 18918 19670 23995 32647 37200 37399 |
| 63rd row: | 6351 6426 13185 13973 16699 22524 31070 31916 |
| 64th row: | 4098 10617 14854 18004 28580 36158 37500 38552 |

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$\lambda_i = s_i$ for $i=0,1,\ldots,K-1$ $p_j = 0$ for $j=0,1,\ldots,M_1+M_2-1$

First information bit $\lambda_0$ is accumulated at parity bit addresses specified in the 1st row of the sequence of the Sequence Table. For example, in an LDPC code having a length of 64800 and a code rate of 5/15, an accumulation process is as follows:

$p_{221}=p_{221}\oplus\lambda_0 \; p_{1011}=p_{1011}\oplus\lambda_0 \; p_{1218}=$
$p_{1218}\oplus\lambda_0 \; p_{4299}=p_{4299}\oplus\lambda_0 \; p_{7143}=p_{7143}\oplus\lambda_0$ $p_{8728}=p_{8728}\oplus\lambda_0 \; p_{11072}=p_{11072}\oplus\lambda_0 \; p_{15533}=$
$p_{15533}\oplus\lambda_0 \; p_{17356}=p_{17356}\oplus\lambda_0$ $p_{33909}=p_{33909}\oplus\lambda_0 \; p_{36833}=p_{36833}\oplus\lambda_0$ where the addition $\oplus$ occurs in GF(2).

The subsequent L-1 information bits, that is, $\lambda_m$, m=1, 2, ..., L-1, are accumulated at parity bit addresses that are calculated by the following Equation 5:

$(x+m\times Q_1) \bmod M_1$ if $x<M_1$ $M_1+\{(x-M_1+m\times Q_2) \bmod M_2\}$ if $x \geq M_1$ (5)

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and L=360. Furthermore, $Q_1$ and $Q_2$ are defined in the following Table 2. For example, for an LDPC code having a length of 64800 and a code rate of 5/15, $M_1=1440$, $Q_1=4$, $M_2=41760$, $Q_2=116$ and L=360, and the following operations are performed on the second bit $\lambda_1$ using Equation 5:

$p_{225}=p_{225}\oplus\lambda_1\, p_{1015}=p_{1015}\oplus\lambda_1\, p_{1222}=$
$p_{1222}\oplus\lambda_1\, p_{4415}=p_{4415}\oplus\lambda_1\, p_{7259}=p_{7259}\oplus\lambda_1$ $p_{8844}=p_{8844}\oplus\lambda_1\, p_{11188}=p_{11188}\oplus\lambda_1\, p_{15649}=$
$p_{15649}\oplus\lambda_1\, p_{17472}=p_{17472}\oplus\lambda_1$ $p_{34025}=p_{34025}\oplus\lambda_1\, p_{36949}=p_{36949}\oplus\lambda_1$ Table 2 illustrates the sizes of $M_1$, $Q_1$, $M_2$ and $Q_2$ of the designed QC-LDPC code:

TABLE 2

| Code rate | Length | $M_1$ | $M_2$ | $Q_1$ | $Q_2$ |
|---|---|---|---|---|---|
| 5/15 | 64800 | 1440 | 41760 | 4 | 116 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i=p_i\oplus p_{i-1} \text{ for } i=0,1,\ldots,M_1-1 \qquad (6)$$

Thereafter, when a parity interleaving operation, such as that of the following Equation 7, is performed, parity bits corresponding to the dual diagonal matrix B are generated:

$$\lambda_{K+L\cdot t+s}=p_{Q_1\cdot s+t} \text{ for } 0\leq s<L,\ 0\leq t<Q_1 \qquad (7)$$

When the parity bits corresponding to the dual diagonal matrix B have been generated using K information bits $\lambda_0$, $\lambda_1,\ldots,\lambda_{K-1}$, parity bits corresponding to the identity matrix D are generated using the $M_1$ generated parity bits $\lambda_K$, $\lambda_{K+1},\ldots,\lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L\cdot t+s}=p_{M_1+Q_2\cdot s+t} \text{ for } 0\leq s<L,\ 0\leq t<Q_2 \qquad (8)$$

Figure 4:
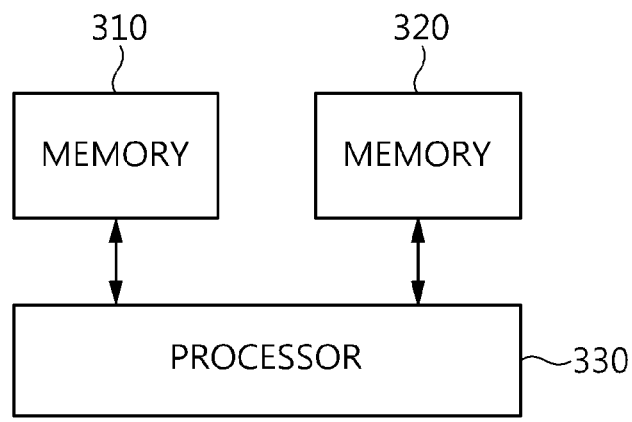
FIG. 4 is a block diagram illustrating an LDPC encoder according to an embodiment of the present invention.

FIG. 4 is a block diagram illustrating an LDPC encoder according to an embodiment of the present invention.

Referring to FIG. 4, the LDPC encoder according to this embodiment of the present invention includes memory 310 and 320 and a processor 330.

The memory 310 is memory that is used to store an LDPC codeword having a length of 64800 and a code rate of 5/15.

The memory 320 is memory that is initialized to 0.

The memory 310 and the memory 320 may correspond to $\lambda_i$ (i=0, 1, ..., N-1) and $p_j$ (j=0, 1, ..., $M_1+M_2-1$), respectively.

The memory 310 and the memory 320 may correspond to various types of hardware for storing sets of bits, and may correspond to data structures, such as an array, a list, a stack and a queue.

The processor 330 generates an LDPC codeword corresponding to information bits by performing accumulation with respect to the memory 320 using a sequence corresponding to a PCM.

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 21600 (=K), a first parity part $\lambda_K$, $\lambda_{K+1}, \ldots, \lambda_{K+M_1-1}$ corresponding to a dual diagonal matrix included in the PCM and having a length of 1440 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 41760 (=$M_2$).

In this case, the sequence may have a number of rows equal to the sum (21600/360+1440/360=64) of a value obtained by dividing the length of the systematic part, that is, 21600, by a CPM size L corresponding to the PCM, that is, 360, and a value obtained by dividing the length $M_1$ of the first parity part, that is, 1440, by 360.

As described above, the sequence may be represented by the above Sequence Table.

In this case, the memory 320 may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

FIG. 5 is a block diagram illustrating an LDPC decoder according to an embodiment of the present invention.

Referring to FIG. 5, the LDPC decoder according to this embodiment of the present invention may include a receiving unit 410 and a decoding unit 420.

The receiving unit 410 receives an LDPC codeword that has been encoded using a sequence that corresponds to a PCM and is represented by the above Sequence Table.

The decoding unit 420 restores information bits from the received LDPC codeword by performing decoding corresponding to the PCM.

In this case, the sequence may be used to update the parity bit addresses of the memory, and the parity bit addresses are used for accumulation that is performed to generate parity bits corresponding to the LDPC codeword.

In this case, the LDPC codeword may include a systematic part $\lambda_0, \lambda_1, \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

FIG. 6 is an operation flowchart illustrating an LDPC encoding method according to an embodiment of the present invention.

Referring to FIG. 6, the LDPC encoding method according to this embodiment of the present invention initializes the first and second memory that stores an LDPC codeword at step S510.

In this case, step S510 may be performed using Equation 4.

Furthermore, in the LDPC encoding method according to this embodiment of the present invention, an LDPC codeword corresponding to information bits is generated by performing accumulation with respect to the second memory using a sequence corresponding to a PCM at step S520.

In this case, the accumulation may be performed at parity bit addresses that are updated using the sequence corresponding to the PCM.

In this case, the LDPC codeword may include a systematic part $\lambda_0, \lambda_1, \ldots, \lambda_{K-1}$ corresponding to the information bits and having a length of 21600 ($=K$), a first parity part $\lambda_K, \lambda_{K+1}, \ldots, \lambda_{K+M_1-1}$ corresponding to a dual diagonal matrix included in the PCM and having a length of 1440 ($=M_1=g$), and a second parity part $\lambda_{K+M_1}, \lambda_{K+M_1+1}, \ldots, \lambda_{K+M_1+M_2-1}$ corresponding to an identity matrix included in the PCM and having a length of 41760 ($=M_2$).

In this case, the sequence may have a number of rows equal to the sum (21600/360+1440/360=64) of a value obtained by dividing the length of the systematic part, that is, 21600, by a CPM size L corresponding to the PCM, that is, 360, and a value obtained by dividing the length $M_1$ of the first parity part, that is, 1440, by 360.

As described above, the sequence may be represented by the above Sequence Table.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L ($=360$) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 7:
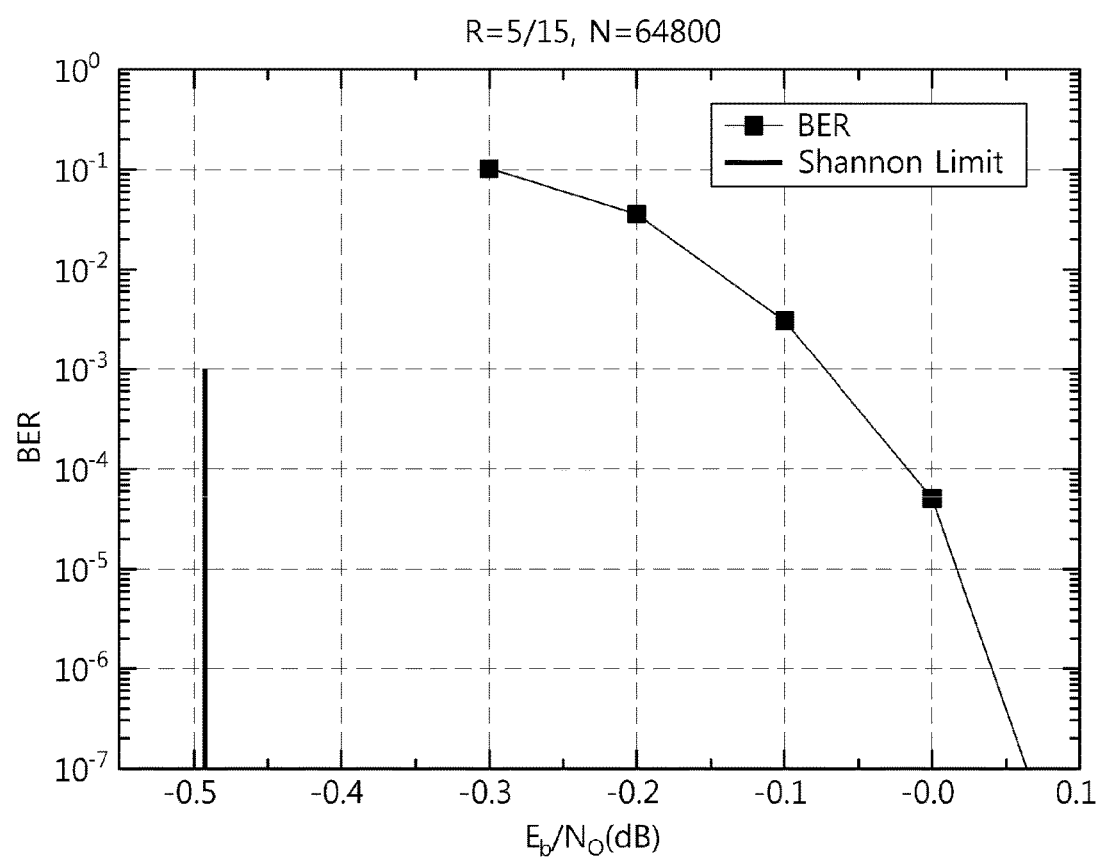
FIG. 7 is a graph plotting the performance of a QC-LDPC code having a length of 64800 and a code rate of 5/15 according to an embodiment of the present invention against $E_b/N_o$.

FIG. 7 is a graph plotting the performance of a QC-LDPC code having a length of 64800 and a code rate of 5/15 according to an embodiment of the present invention against $E_b/N_o$.

The graph illustrated in FIG. 7 illustrates results that were obtained on the assumption that a log-likelihood ratio (LLR)-based sum-product algorithm in which binary phase shift keying (BPSK) modulation and 50 rounds of repetitive decoding were performed was used for computational experiments. As illustrated in FIG. 7, it can be seen that the designed code is away from the Shannon limit by about 0.55 dB at BER=$10^{-6}$.

At least one embodiment of the present invention has the advantage of providing a new LDPC codeword having a length of 64800 and a code rate of 5/15, which is capable of being used for general purposes.

At least one embodiment of the present invention has the advantage of providing an LDPC encoding technique that is capable of efficiently performing LDPC encoding using a sequence having a number of rows equal to a value that is obtained by dividing the sum of the length of the systematic part of an LDPC codeword, that is, 21600, and the length of the first parity part of the LDPC codeword, that is, 1440, by 360.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A low density parity check (LDPC) decoder, comprising:
a receiving unit configured to receive a signal corresponding to an LDPC codeword having a length of 64800 and a code rate of 5/15, the LDPC codeword encoded using a sequence corresponding to a parity check matrix (PCM) and
a decoding unit configured to perform decoding the received signal, the decoding corresponding to the parity check matrix,
wherein the sequence is represented by the following Sequence Table:

| Sequence Table | |
|---|---|
| 1st row: | 221 1011 1218 4299 7143 8728 11072 15533 17356 33909 36833 |
| 2nd row: | 360 1210 1375 2313 3493 16822 21373 23588 23656 26267 34098 |
| 3rd row: | 544 1347 1433 2457 9186 10945 13583 14858 19195 34606 37441 |
| 4th row: | 37 596 715 4134 8091 12106 24307 24658 34108 40591 42883 |
| 5th row: | 235 398 1204 2075 6742 11670 13512 23231 24784 27915 34752 |

Sequence Table (-continued)

| Row | Values |
|---|---|
| 6th row: | 204 873 890 13550 16570 19774 34012 35249 37655 39885 42890 |
| 7th row: | 221 371 514 11984 14972 15690 28827 29069 30531 31018 43121 |
| 8th row: | 280 549 1435 1889 3310 10234 11575 15243 20748 30469 36005 |
| 9th row: | 223 666 1248 13304 14433 14732 18943 21248 23127 38529 39272 |
| 10th row: | 370 819 1065 9461 10319 25294 31958 33542 37458 39681 40039 |
| 11st row: | 585 870 1028 5087 5216 12228 16216 16381 16937 27132 27893 |
| 12nd row: | 164 167 1210 7386 11151 20413 22713 23134 24188 36771 38992 |
| 13rd row: | 298 511 809 4620 7347 8873 19602 24162 29198 34304 41145 |
| 14th row: | 105 830 1212 2415 14759 15440 16361 16748 22123 32684 42575 |
| 15th row: | 659 665 668 6458 22130 25972 30697 31074 32048 36078 37129 |
| 16th row: | 91 808 953 8015 8988 13492 13987 15979 28355 34509 39698 |
| 17th row: | 594 983 1265 3028 4029 9366 11069 11512 27066 40939 41639 |
| 18th row: | 506 740 1321 1484 10747 16376 17384 20285 31502 38925 42606 |
| 19th row: | 338 356 975 2022 3578 18689 18772 19826 22914 24733 27431 |
| 20th row: | 709 1264 1366 4617 8893 25226 27800 29080 30277 37781 39644 |
| 21st row: | 840 1179 1338 2973 3541 7043 12712 15005 17149 19910 36795 |
| 22nd row: | 1009 1267 1380 4919 12679 22889 29638 30987 34637 36232 37284 |
| 23rd row: | 466 913 1247 1646 3049 5924 9014 20539 34546 35029 36540 |
| 24th row: | 374 697 984 1654 5870 10883 11684 20294 28888 31612 34031 |
| 25th row: | 117 240 635 5093 8673 11323 12456 14145 21397 39619 42559 |
| 26th row: | 122 1265 1427 13528 14282 15241 16852 17227 34723 36836 39791 |
| 27th row: | 595 1180 1310 6952 17916 24725 24971 27243 29555 32138 35987 |
| 28th row: | 140 470 1017 13222 13253 18462 20806 21117 28673 31598 37235 |
| 29th row: | 7 710 1072 8014 10804 13303 14292 16690 26676 36443 41966 |
| 30th row: | 48 189 759 12438 14523 16388 23178 27315 28656 29111 29694 |
| 31st row: | 285 387 410 4294 4467 5949 25386 27898 34880 41169 42614 |
| 32nd row: | 474 545 1320 10506 13186 18126 27110 31498 35353 36193 37322 |
| 33rd row: | 1075 1130 1424 11390 13312 14161 16927 25071 25844 34287 38151 |
| 34th row: | 161 396 427 5944 17281 22201 25218 30143 35566 38261 42513 |
| 35th row: | 233 247 694 1446 3180 3507 9069 20764 21940 33422 39358 |
| 36th row: | 271 508 1013 6271 21760 21858 24887 29808 31099 35475 39924 |
| 37th row: | 8 674 1329 3135 5110 14460 28108 28388 31043 31137 31863 |
| 38th row: | 1035 1222 1409 8287 16083 24450 24888 29356 30329 37834 39684 |
| 39th row: | 391 1090 1128 1866 4095 10643 13121 14499 20056 22195 30593 |
| 40th row: | 55 161 1402 6289 6837 8791 17937 21425 26602 30461 37241 |
| 41st row: | 110 377 1228 6875 13253 17032 19008 23274 22285 33452 41630 |
| 42nd row: | 360 638 1355 5933 12593 13533 23377 23881 24586 26040 41663 |
| 43rd row: | 535 1240 1333 3354 10860 16032 32573 34908 34957 39255 40759 |
| 44th row: | 526 936 1321 7992 10260 18527 28248 29236 32636 34666 35552 |
| 45th row: | 336 785 875 7530 13062 13075 18925 27963 28703 33688 36502 |
| 46th row: | 36 591 1062 1518 3821 7048 11197 17781 19408 22731 24783 |
| 47th row: | 214 1145 1223 1546 9475 11170 16061 21273 38688 40051 42479 |
| 48th row: | 1136 1226 1423 20227 22573 24951 26462 29586 34915 42441 43048 |
| 49th row: | 26 276 1425 6048 7224 7917 8747 27559 28515 35002 37649 |
| 50th row: | 127 294 437 4029 8585 9647 11904 24115 28514 36893 39722 |
| 51st row: | 748 1093 1403 9536 19305 20468 31049 38667 40502 40720 41949 |
| 52nd row: | 96 638 743 9806 12101 17751 22732 24937 32007 32594 38504 |
| 53rd row: | 649 904 1079 2770 3337 9158 20125 24619 32921 33698 35173 |
| 54th row: | 401 518 984 7372 12438 12582 18704 35874 39420 39503 39790 |
| 55th row: | 10 451 1077 8078 16320 17409 25807 28814 30613 41261 42955 |
| 56th row: | 405 592 1178 15936 18418 19585 21966 24219 30637 34536 37838 |
| 57th row: | 50 584 851 9720 11919 22544 22545 25851 35567 41587 41876 |
| 58th row: | 911 1113 1176 1806 10058 10809 14220 19044 20748 29424 36671 |
| 59th row: | 441 550 1135 1956 11254 18699 30249 33099 34587 35243 39952 |
| 60th row: | 510 1016 1281 8621 13467 13780 15170 16289 20925 26426 34479 |
| 61st row: | 4969 5223 17117 21950 22144 24043 27151 39809 |
| 62nd row: | 11452 13622 18918 19670 23995 32647 37200 37399 |
| 63rd row: | 6351 6426 13185 13973 16699 22524 31070 31916 |
| 64th row: | 4098 10617 14854 18004 28580 36158 37500 38552. |

2. The LDPC decoder of claim 1, wherein the LDPC codeword comprises a systematic part corresponding to the information bits and having a length of 21600, a first parity part corresponding to a dual diagonal matrix included in the PCM and having a length of 1440, and a second parity part corresponding to an identity matrix included in the PCM and having a length of 41760.

3. The LDPC decoder of claim 2, wherein the sequence has a number of rows equal to a sum of a value obtained by dividing a length of the systematic part by a circulant permutation matrix (CPM) size corresponding to the PCM, and a value obtained by dividing a length of the first parity part by the CPM size.

4. The LDPC decoder of claim 1, wherein the LDPC codeword is generated by performing accumulation with respect to a memory and the accumulation is performed at parity bit addresses that are updated using the sequence.

5. The LDPC decoder of claim 4, wherein the accumulation is performed while the rows of the sequence are being repeatedly changed by the CPM size of the PCM.

6. A low density parity check (LDPC) decoding method, comprising:

receiving a signal corresponding to an LDPC codeword having a length of 64800 and a code rate of 5/15, the LDPC codeword encoded using a sequence corresponding to a parity check matrix (PCM); and decoding the received signal, the decoding corresponding to the parity check matrix, wherein the sequence is represented by the following Sequence Table:

Sequence Table

1st row: 221 1011 1218 4299 7143 8728 11072 15533 17356 33909 36833
2nd row: 360 1210 1375 2313 3493 16822 21373 23588 23656 26267 34098
3rd row: 544 1347 1433 2457 9186 10945 13583 14858 19195 34606 37441
4th row: 37 596 715 4134 8091 12106 24307 24658 34108 40591 42883
5th row: 235 398 1204 2075 6742 11670 13512 23231 24784 27915 34752
6th row: 204 873 890 13550 16570 19774 34012 35249 37655 39885 42890
7th row: 221 371 514 11984 14972 15690 28827 29069 30531 31018 43121
8th row: 280 549 1435 1889 3310 10234 11575 15243 20748 30469 36005
9th row: 223 666 1248 13304 14433 14732 18943 21248 23127 38529 39272
10th row: 370 819 1065 9461 10319 25294 31958 33542 37458 39681 40039
11th row: 585 870 1028 5087 5216 12228 16216 16381 16937 27132 2789 37129
12th row: 164 167 1210 7386 11151 20413 22713 23134 24188 36771 38992
13th row: 298 511 809 4620 7347 8873 19602 24162 29198 34304 41145
14th row: 105 830 1212 2415 14759 15440 16361 16748 22123 32684 42575
15th row: 659 665 668 6458 22130 25972 30697 31074 32048 36078 37129
16th row: 91 808 953 8015 8988 13492 13987 15979 28355 34509 39698
17th row: 594 983 1265 3028 4029 9366 11069 11512 27066 40939 41639
18th row: 506 740 1321 1484 10747 16376 17384 20285 31502 38925 42606
19th row: 338 356 975 2022 3578 18689 18772 19826 22914 24733 27431
20th row: 709 1264 1366 4617 8893 25226 27800 29080 30277 37781 39644
21st row: 840 1179 1338 2973 3541 7043 12712 15005 17149 19910 36795
22nd row: 1009 1267 1380 4919 12679 22889 29638 30987 34637 36232 37284
23rd row: 466 913 1247 1646 3049 5924 9014 20539 34546 35029 36540
24th row: 374 697 984 1654 5870 10883 11684 20294 28888 31612 34031
25th row: 117 240 635 5093 8673 11323 12456 14145 21397 39619 42559
26th row: 122 1265 1427 13528 14282 15241 16852 17227 34723 36836 39791
27th row: 595 1180 1310 6952 17916 24725 24971 27243 29555 32138 35987
28th row: 140 470 1017 13222 13253 18462 20806 21117 28673 31598 37235
29th row: 7 710 1072 8014 10804 13303 14292 16690 26676 36443 41966
30th row: 48 189 759 12438 14523 16388 23178 27315 28656 29111 29694
31st row: 285 387 410 4294 4467 5949 25386 27898 34880 41169 42614
32nd row: 474 545 1320 10506 13186 18126 27110 31498 35353 36193 37322
33rd row: 1075 1130 1424 11390 13312 14161 16927 25071 25844 34287 38151
34th row: 161 396 427 5944 17281 22201 25218 30143 35566 38261 42513
35th row: 233 247 694 1446 3180 3507 9069 20764 21940 33422 39358
36th row: 271 508 1013 6271 21760 21858 24887 29808 31099 35475 39924
37th row: 8 674 1329 3135 5110 14460 28108 28388 31043 31137 31863
38th row: 1035 1222 1409 8287 16083 24450 24888 29356 30329 37834 39684
39th row: 391 1090 1128 1866 4095 10643 13121 14499 20056 22195 30593
40th row: 55 161 1402 6289 6837 8791 17937 21425 26602 30461 37241
41st row: 110 377 1228 6875 13253 17032 19008 23274 32285 33452 41630
42nd row: 360 638 1355 5933 12593 13533 23377 23881 24586 26040 41663
43rd row: 535 1240 1333 3354 10860 16032 32573 34908 34957 39255 40759
44th row: 526 936 1321 7992 10260 18527 28248 29356 32636 34666 35552
45th row: 336 785 875 7530 13062 13075 18925 27963 28703 33688 36502
46th row: 36 591 1062 1518 3821 7048 11197 17781 19408 22731 24783
47th row: 214 1145 1223 1546 9475 11170 16061 21273 38688 40051 42479
48th row: 1136 1226 1423 20227 22573 24951 26462 29586 34915 42441 43048
49th row: 26 276 1425 6048 7224 7917 8747 27559 28515 35002 37649
50th row: 127 294 437 4029 8585 9647 11904 24115 28514 36893 39722
51st row: 748 1093 1403 9536 19305 20468 31049 38667 40502 40720 41949
52nd row: 96 638 743 9806 12101 17751 22732 24937 32007 32594 38504
53rd row: 649 904 1079 2770 3337 9158 20125 24619 32921 33698 35173
54th row: 401 518 984 7372 12438 12582 18704 35874 39420 39503 39790
55th row: 10 451 1077 8078 16320 17409 25807 28814 30613 41261 42955
56th row: 405 592 1178 15936 18418 19585 21966 24219 30637 34536 37838
57th row: 50 584 851 9720 11919 22544 22545 25851 35567 41587 41876
58th row: 911 1113 1176 1806 10058 10809 14220 19044 20748 29424 36671
59th row: 441 550 1135 1956 11254 18699 30249 33099 34587 35243 39952
60th row: 510 1016 1281 8621 13467 13780 15170 16289 20925 26426 34479
61st row: 4969 5223 17117 21950 22144 24043 27151 39809
62nd row: 11452 13622 18918 19670 23995 32647 37200 37399
63rd row: 6351 6426 13185 13973 16699 22524 31070 31916
64th row: 4098 10617 14854 18004 28580 36158 37500 38552.

* * * * *